United States Patent
Ohashi et al.

(10) Patent No.: US 9,642,275 B2
(45) Date of Patent: *May 2, 2017

(54) POWER MODULE

(71) Applicant: MITSUBISHI MATERIALS CORPORATION, Tokyo (JP)

(72) Inventors: Touyou Ohashi, Kitamoto (JP); Yoshiyuki Nagatomo, Saitama (JP); Toshiyuki Nagase, Gotenba (JP); Yoshirou Kuromitsu, Saitama (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/654,199

(22) PCT Filed: Dec. 20, 2013

(86) PCT No.: PCT/JP2013/084257
§ 371 (c)(1),
(2) Date: Jun. 19, 2015

(87) PCT Pub. No.: WO2014/103934
PCT Pub. Date: Jul. 3, 2014

(65) Prior Publication Data
US 2015/0319877 A1   Nov. 5, 2015

(30) Foreign Application Priority Data
Dec. 25, 2012 (JP) .................................. 2012-281345

(51) Int. Cl.
*H05K 7/02* (2006.01)
*B23K 35/26* (2006.01)
(Continued)

(52) U.S. Cl.
CPC ............ *H05K 7/02* (2013.01); *B23K 35/0272* (2013.01); *B23K 35/26* (2013.01); *B23K 35/262* (2013.01);
(Continued)

(58) Field of Classification Search
USPC .......................................... 361/761; 174/257
See application file for complete search history.

(56) References Cited

U.S. PATENT DOCUMENTS 5,536,972 A * 7/1996 Kato .................. H01L 23/3121
257/706
8,198,540 B2   6/2012 Kuromitsu et al.
(Continued)

FOREIGN PATENT DOCUMENTS

CN   1812083 A    8/2006
EP   0985486 A1   3/2000
(Continued)

OTHER PUBLICATIONS

K. Nogita et al., "Inhibition of Cracking in $Cu_6Sn_5$ Intermetallic Compounds at Sn—Cu Lead-Free Solders and Cu Substrate Interfaces," International Conference on Electronics Packaging (ICEP) 2009, [online], Apr. 16, 2009, pp. 1-6.
(Continued)

*Primary Examiner* — William H Mayo, III
*Assistant Examiner* — Krystal Robinson
(74) *Attorney, Agent, or Firm* — Locke Lord LLP

(57) ABSTRACT

A power module has a copper layer composed of copper or a copper alloy on a surface of a circuit layer to which a semiconductor device is bonded, and a solder layer that is formed by using a solder material is formed between the circuit layer and the semiconductor device. An average crystal grain size which is measured by EBSD measurement in a region having a thickness of up to 30 μm from the
(Continued)

surface of the circuit layer in the solder layer is 10 μm or less, the solder layer has a composition that contains Sn as a main component, 0.01 to 1.0% by mass of Ni, and 0.1 to 5.0% by mass of Cu, and a thermal resistance increase rate when a power cycle is loaded 100,000 times is less than 10% in a power cycle test.

2 Claims, 9 Drawing Sheets

(51) Int. Cl.
    *C22C 13/00*     (2006.01)
    *H01L 23/00*     (2006.01)
    *H01L 23/373*     (2006.01)
    *H01L 23/488*     (2006.01)
    *B23K 35/30*     (2006.01)
    *B23K 35/02*     (2006.01)
    *B32B 15/01*     (2006.01)
    *B23K 101/40*     (2006.01)
    *B23K 101/42*     (2006.01)
    *H01L 23/473*     (2006.01)

(52) U.S. Cl.
CPC .......... *B23K 35/302* (2013.01); *B32B 15/017* (2013.01); *C22C 13/00* (2013.01); *H01L 23/3735* (2013.01); *H01L 23/488* (2013.01); *H01L 24/29* (2013.01); *H01L 24/32* (2013.01); *H01L 24/83* (2013.01); *B23K 2201/40* (2013.01); *B23K 2201/42* (2013.01); *H01L 23/473* (2013.01); *H01L 2224/29111* (2013.01); *H01L 2224/32225* (2013.01); *H01L 2224/83455* (2013.01); *H01L 2224/83801* (2013.01); *H01L 2924/0133* (2013.01); *H01L 2924/01322* (2013.01); *H01L 2924/13055* (2013.01); *H01L 2924/351* (2013.01)

(56) References Cited

U.S. PATENT DOCUMENTS

| | | | |
|---|---|---|---|
| 2002/0109152 A1 | 8/2002 | Kobayashi et al. | |
| 2005/0077617 A1* | 4/2005 | Hirano | H01L 23/4334 257/712 |
| 2007/0274047 A1 | 11/2007 | Nagase et al. | |
| 2008/0240201 A1* | 10/2008 | Koike | G01N 25/72 374/5 |
| 2009/0229864 A1 | 9/2009 | Kuromitsu et al. | |
| 2009/0267215 A1 | 10/2009 | Kitahara et al. | |
| 2010/0264539 A1* | 10/2010 | Miura | H01L 21/563 257/738 |
| 2012/0234584 A1* | 9/2012 | Ejiri | H05K 3/244 174/257 |

FOREIGN PATENT DOCUMENTS

| | | |
|---|---|---|
| EP | 1187198 A2 | 3/2002 |
| EP | 2312622 A2 | 4/2011 |
| JP | 3152945 B2 | 1/2001 |
| JP | 2002-076551 A | 3/2002 |
| JP | 2003-133474 A | 5/2003 |
| JP | 2004-172378 A | 6/2004 |
| JP | 2005-116963 A | 4/2005 |
| JP | 2006-066716 A | 3/2006 |
| JP | 2006-289434 A | 10/2006 |
| JP | 2008-098212 A | 4/2008 |
| JP | 2008-130697 A | 6/2008 |
| JP | 2008-227336 A | 9/2008 |
| JP | 2009-076611 A | 4/2009 |
| JP | 2010-087072 A | 4/2010 |
| JP | 2011-143442 A | 7/2011 |
| WO | WO-99/48639 A1 | 9/1999 |
| WO | 2009/051255 A1 | 4/2009 |

OTHER PUBLICATIONS

International Search Report mailed Mar. 25, 2014, issued for PCT/JP2013/084257 and English translation thereof.
Notice of Allowance mailed Jul. 15, 2014, issued for the Japanese patent application No. 2013-264197 and English translation thereof.
International Search Report mailed Mar. 25, 2014, issued for PCT/JP2013/084329 and English translation thereof.
Office Action mailed Jul. 15, 2014, issued for the Japanese patent application No. 2013-264216 and English translation thereof.
Office Action mailed Oct. 13, 2015, issued for the Japanese patent application No. 2013-264216 and English translation thereof.
Notice of Allowance mailed Apr. 7, 2016, issued for U.S. Appl. No. 14/654,159.
Supplementary European Search Report mailed Jul. 14, 2016, issued for the European Patent Application No. 13868335.4.
Hiroshi Nishikawa et al: "Interfacial Reaction between Sn-0.7Cu (-Ni) Solder and Cu Substrate", Journal of Electronic Materials, vol. 35, No. 5, May 1, 2006, pp. 1127-1132.
Petr Harcuba et al., "Microstructure Changes and Physical Properties of the Intermetallic Compounds Formed at the Interface Between Sn—Cu Solders and a Cu Substrate Due to a Minor Addition of Ni", Journal of Electronic Materials., vol. 39, No. 12, Sep. 14, 2010, pp. 2553-2557.
Kazuhiro Nogita et al., "Inhibiting Cracking of Interfacial Cu6Sn5 by Ni Additions to Sn- based Lead-free Solders", vol. 2, No. 1, Jan. 1, 2009, pp. 46-54.
Search Report mailed Jul. 21, 2016, issued for European patent application No. 13868095.4.
Office Action mailed Feb. 22, 2017, issued for the Chinese patent application No. 201380067852.6 and a partial English translation of the search report.

* cited by examiner

POWER MODULE

CROSS REFERENCE TO RELATED APPLICATIONS

This application is related to co-pending application: "POWER MODULE" filed even date herewith in the names of Touyou OHASHI, Yoshiyuki NAGATOMO, Toshiyuki NAGASE and Yoshirou KUROMITSU as a national phase entry of PCT/JP2013/084329, which application is assigned to the assignee of the present application and is incorporated by reference herein.

TECHNICAL FIELD

The present invention relates to a power module obtained by bonding a circuit layer including a copper layer composed of copper or a copper alloy and a semiconductor device together using a solder material.

Priority is claimed on Japanese Patent Application No. 2012-281345, filed Dec. 25, 2012, the content of which is incorporated herein by reference.

BACKGROUND ART

For example, as disclosed in PTLs 1 and 2, the aforementioned power module includes a power module substrate obtained by bonding a metal plate serving as a circuit layer to one surface of an insulating substrate, and a power device (semiconductor device) mounted on the circuit layer.

In addition, a heat sink such as a radiator plate or a cooler is arranged on the other surface of the power module substrate to radiate heat from the power device (semiconductor device) in some cases. At this time, in order to reduce the thermal stress caused by the difference of thermal expansion coefficients of the insulating substrate and the heat sink such as a radiator plate or a cooler, the power module substrate is configured such that a metal plate serving as the metal layer is bonded to the other surface of the insulating substrate and the metal layer and the aforementioned heat sink such as a radiator plate or a cooler are bonded to each other.

In the aforementioned power module, the circuit layer and the power device (semiconductor device) are bonded through the solder material.

Here, when the circuit layer is composed of aluminum or an aluminum alloy, for example, as disclosed in PTL 3, it is necessary to form a Ni plating film on the surface of the circuit layer by electroplating or the like and to arrange the solder material on the Ni plating film to bond the semiconductor device to the circuit layer.

In addition, when the circuit layer is composed of copper or a copper alloy, a Ni plating film is formed on the surface of the circuit layer and the solder material is arranged on the Ni plating film to bond the semiconductor device to the circuit layer.

CITATION LIST

Patent Literature

[PTL 1] Japanese Unexamined Patent Application, First Publication No. 2002-076551

[PTL 2] Japanese Unexamined Patent Application, First Publication No. 2008-227336

[PTL 3] Japanese Unexamined Patent Application, First Publication No. 2004-172378

SUMMARY OF INVENTION

Technical Problem

However, for example, as described in PTL 3, when a power cycle is loaded on the power module in which the semiconductor device is bonded to the circuit layer by soldering by forming the Ni plating film on the surface of the circuit layer composed of aluminum or an aluminum alloy, cracks are initiated in the solder layer and the thermal resistance is likely to increase.

In addition, when a power cycle is loaded on the power module in which the semiconductor device is bonded to the circuit layer by soldering by forming the Ni plating film on the surface of the circuit layer composed of copper or a copper alloy, cracks are initiated in the solder layer and the thermal resistance is likely to increase.

In recent years, a power device for controlling higher amounts of power to control wind power generation or electric vehicles such as electric automobiles has been mounted on the aforementioned power module or the like. Thus, it is necessary to further improve the reliability with respect to the power cycle more than before.

The present invention has been made in consideration of the above-described circumstances and an object thereof is to provide a power module capable of suppressing the occurrence of cracks in a solder layer even when a power cycle is loaded and having high reliability.

Solution to Problem

As a result of extensive investigation conducted by the present inventors, it has been confirmed that when a power cycle is loaded on a power module obtained by forming a Ni plating film on the surface of a circuit layer composed of aluminum, an aluminum alloy, copper or a copper alloy and bonding a semiconductor device to the circuit layer by soldering, cracks are initiated in the Ni plating and the cracks are propagated along the crystal grain boundaries of a solder layer to cause cracks to be initiated in the solder layer. As a result of further extensive investigation, it has also been found that crack propagation in the solder layer can be suppressed by reducing the crystal grain size of the solder layer.

The present invention has been made based on the aforementioned findings.

(1) According to an aspect of the present invention, there is provided a power module including a power module substrate that has a circuit layer arranged on one surface of an insulating layer, and a semiconductor device that is bonded to one surface of the circuit layer, wherein a copper layer composed of copper or a copper alloy is formed on the surface of the circuit layer to which the semiconductor device is bonded, a solder layer that is formed by using a solder material is formed between the circuit layer and the semiconductor device, an average crystal grain size which is measured by EBSD measurement in a region having a thickness of up to 30 μm from the surface of the circuit layer in the solder layer is within a range of 0.1 to 10 μm, the solder layer has a composition that contains Sn as a main component, 0.01 to 1.0% by mass of Ni, and 0.1 to 5.0% by mass of Cu, and a thermal resistance increase rate when a power cycle is loaded 100,000 times under conditions of a conduction duration of 5 seconds and a temperature difference of 80° C. is less than 10% in a power cycle test.

According to the power module having this configuration, since the average crystal grain size in a region having a thickness of up to 30 μm from the surface of the circuit layer (the copper layer) in the solder layer between the circuit layer having a copper layer provided on the surface to be bonded with the semiconductor device and the semiconductor device is 10 μm or less and is relatively fine, for example, cracks initiated near the interface of the circuit layer (copper layer) are less likely to be propagated into the solder layer along the crystal grain boundaries, and thus breaking down of the solder layer can be suppressed. In addition, the average crystal grain size in the region having a thickness of up to 30 μm from the surface of the circuit layer (the copper layer) in the solder layer is preferably within a range of 0.5 to 10 μm.

Further, since the solder layer has a composition that contains Sn as a main component, 0.01 to 1.0% by mass of Ni, and 0.1 to 5.0% by mass of Cu, precipitate particles composed of an intermetallic compound including any of Cu, Ni, and Sn are dispersed in the solder layer and as described above, the crystal grain size of the solder layer can be refined.

Further, in the power module of the present invention, since a thermal resistance increase rate when a power cycle is loaded 100,000 times under the conditions of a conduction duration of 5 seconds and a temperature difference of 80° C. is less than 10% in a power cycle test, even in a case in which the power cycle is loaded in a repeated manner, the solder layer is not broken down at an early stage and the reliability with respect to the power cycle can be improved. Since the above-described power cycle test has a condition in which the maximum load is applied to the solder layer, as long as the thermal resistance increase rate when the power cycle is loaded 100,000 times under the condition is less than 10%, sufficient reliability can be obtained in normal use.

(2) In the power module according to (1), precipitate particles composed of $(Cu, Ni)_6Sn_5$ are dispersed in the solder layer.

In this case, since precipitate particles composed of $(Cu, Ni)_6Sn_5$ are dispersed in the solder layer, the crystal grain size of the solder layer can be reliably refined and breaking down of the solder layer during loading of a power cycle can be reliably suppressed.

Advantageous Effects of Invention

According to the present invention, it is possible to provide a power module capable of suppressing the initiation of cracks in a solder layer at an early stage even when a power cycle is loaded, and having high reliability.

DESCRIPTION OF EMBODIMENTS

Hereinafter, a power module which is an embodiment of the present invention will be described with reference to the attached drawings.

First Embodiment

Figure 1:
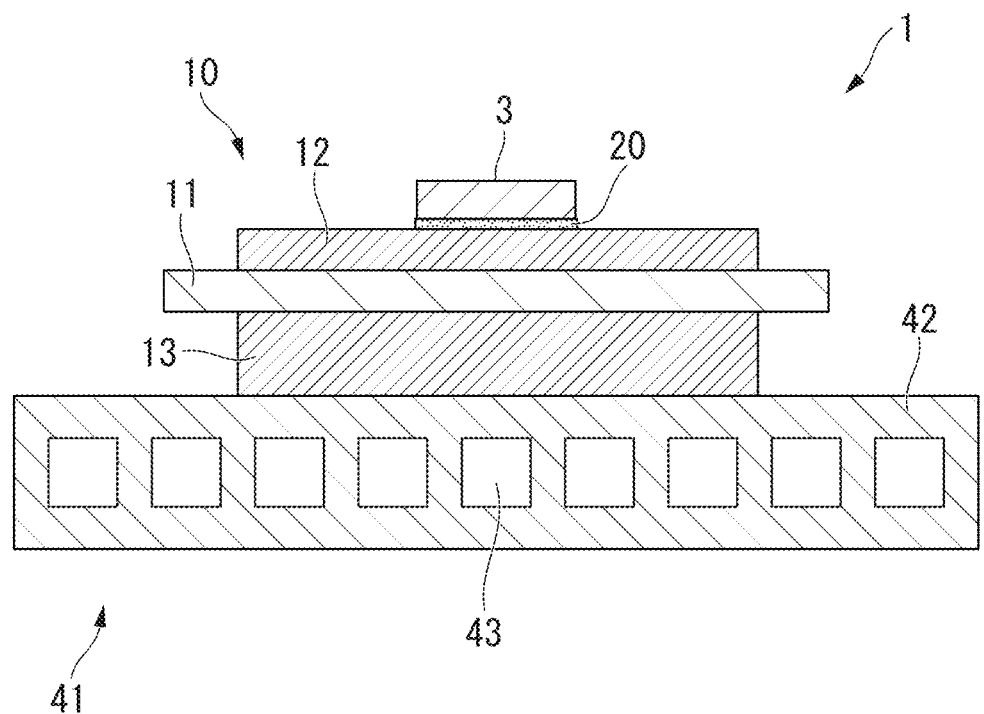
FIG. 1 is a schematic explanatory diagram of a power module which is a first embodiment of the present invention.

In FIG. 1, a power module 1 which is a first embodiment of the present invention is shown. The power module 1 includes a power module substrate 10 in which a circuit layer 12 is arranged on one surface (first surface) of an insulating substrate (insulating layer) 11, and a semiconductor device 3 that is mounted on the circuit layer 12 (the upper surface in FIG. 1). In the power module 1 of the present embodiment, a heat sink 41 is bonded on the side of the other surface of the insulating substrate 11 (which is the second surface side thereof and the lower surface in FIG. 1).

The power module substrate 10 includes the insulating substrate 11 that forms the insulating layer, the circuit layer 12 that is arranged on one surface of the insulating substrate 11 (which is the first surface and the upper surface in FIG. 1), and a metal layer 13 that is arranged on the other surface of the insulating substrate 11 (which is the second surface and the lower surface in FIG. 1).

The insulating substrate 11 prevents electrical connection between the circuit layer 12 and the metal layer 13 and is composed of ceramics having a high degree of insulation such as AlN (aluminum nitride), $Si_3N_4$ (silicon nitride), or $Al_2O_3$ (alumina), and in the present embodiment, the insulating substrate 11 is composed of AlN (aluminum nitride) having a high degree of insulation. In addition, the thickness of the insulating substrate 11 is set to be within a range of 0.2 to 1.5 mm and is set to 0.635 mm in the present embodiment.

The circuit layer 12 is formed by bonding a conductive metal plate to the first surface of the insulating substrate 11. In the present embodiment, the circuit layer 12 is formed by bonding a copper plate that is composed of a rolled plate of oxygen-free copper to the insulating substrate 11. In the present embodiment, the entire circuit layer 12 corresponds to a copper layer composed of copper or a copper alloy provided on the bonding surface with the semiconductor device 3. Here, the thickness of the circuit layer 12 (the thickness of the copper plate) is preferably set to be within a range of 0.1 to 1.0 mm.

The metal layer 13 is formed by bonding a metal plate to the second surface of the insulating substrate 11. In the present embodiment, the metal layer 13 is formed by bonding an aluminum plate formed with a rolled plate of aluminum (so-called 4N aluminum) having a purity of 99.99% by mass or more to the insulating substrate 11. Here, the thickness of the metal layer 13 (aluminum plate) is preferably set to be within a range of 0.6 to 3.0 mm.

The heat sink 41 is used for cooling the aforementioned power module substrate 10 and includes a top plate portion 42 to be bonded with the power module substrate 10, and a flow passage 43 in which a cooling medium (for example, cooling water) flows. The heat sink 41 (top plate portion 42) is desirably composed of a material having excellent thermal conductivity and is composed of aluminum material of A6063 (aluminum alloy) in the present embodiment.

Figure 2:
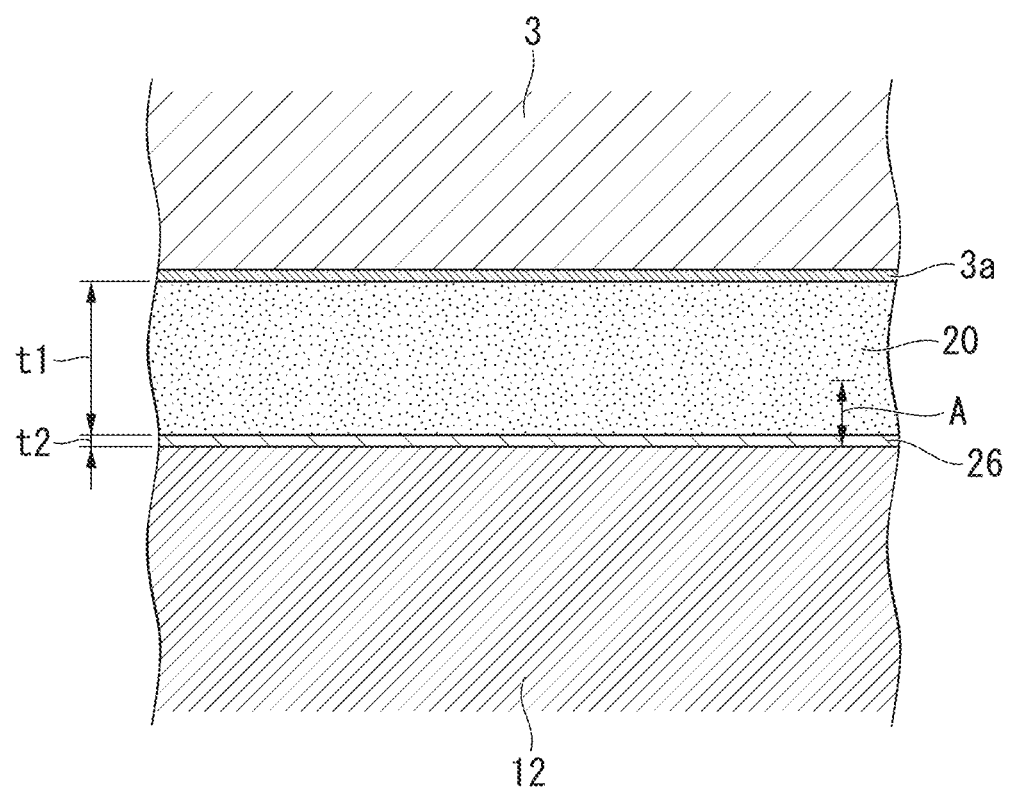
FIG. 2 is an enlarged explanatory diagram of a portion in which a circuit layer and a semiconductor device are bonded to each other in FIG. 1.

The semiconductor device 3 is composed of a semiconductor material such as Si and as shown in FIG. 2, a surface treatment film 3a composed of Ni, Au, and the like is formed on the surface to be bonded with the circuit layer 12.

In the power module 1 which is the present embodiment, the circuit layer 12 and the semiconductor device 3 are bonded to each other by soldering and a solder layer 20 is formed between the circuit layer 12 and the semiconductor device 3. In the present embodiment, the thickness t1 of the solder layer 20 is set to be within a range of 50 to 200 μm.

Figure 4:
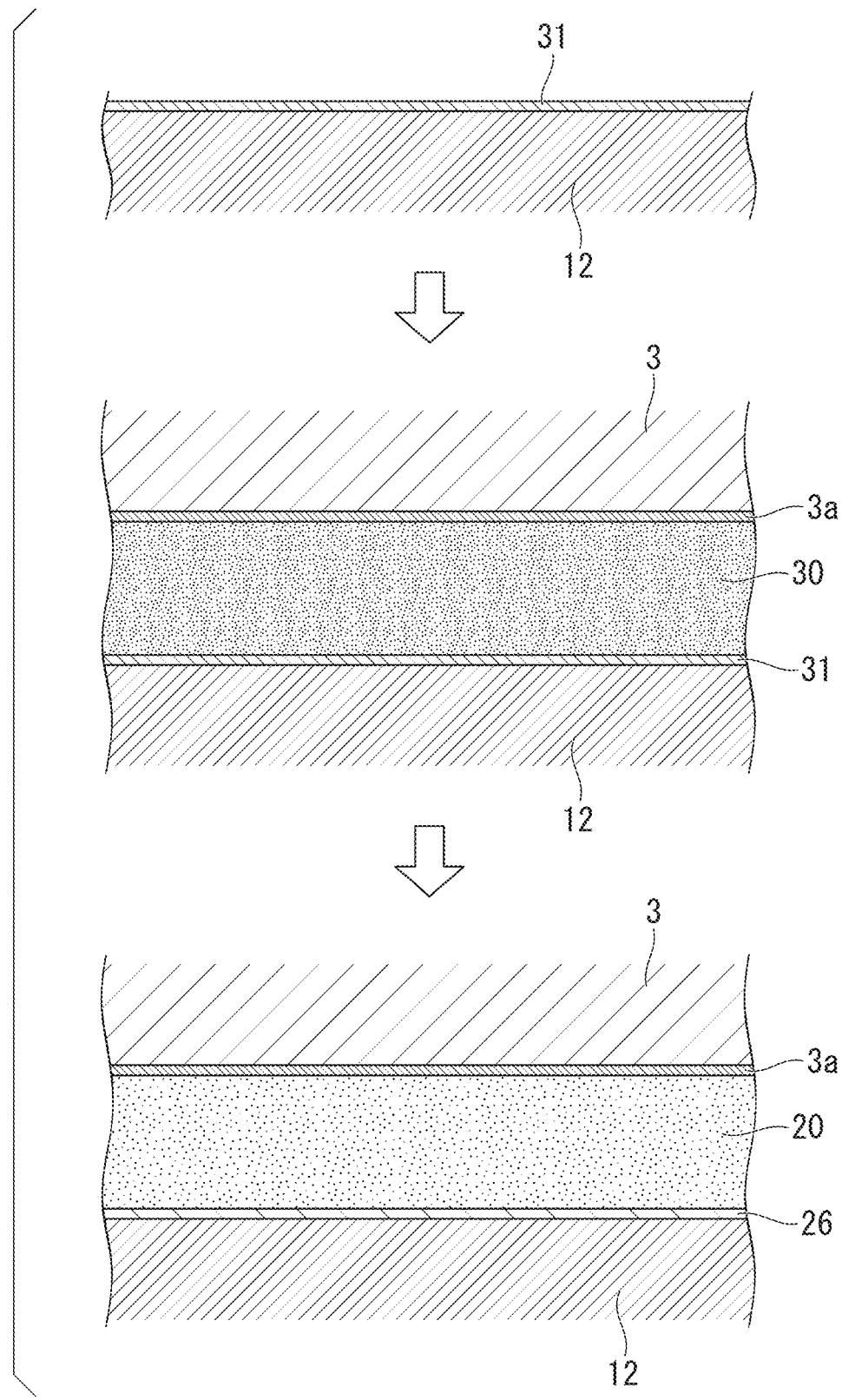
FIG. 4 is an explanatory diagram of a semiconductor device bonding step in the method of producing the power module shown in FIG. 3.

As shown in FIG. 4, the solder layer 20 is formed by using a Sn—Cu—Ni-based solder material 30, and in the present embodiment, a solder material 30 composed of a Sn-0.1 to 4% by mass of Cu-0.01 to 1% by mass of Ni alloy is used.

Here, as shown in FIG. 2, an intermetallic compound layer 26 is formed on the surface of the circuit layer 12 and the solder layer 20 is arranged on the intermetallic compound layer 26 in a laminated manner. This intermetallic compound layer 26 is composed of an intermetallic compound of Cu and Sn ($Cu_3Sn$). The thickness t2 of the intermetallic compound layer 26 is 0.8 μm or less.

The solder layer 20 has a composition containing Sn as a main component, 0.01 to 1.0% by mass of Ni, and 0.1 to 5.0% by mass of Cu.

As shown in FIG. 2, the average crystal grain size which is measured by EBSD (Electron Backscatter Diffraction) measurement in a region A having a thickness of up to 30 μm from the surface of the circuit layer 12 in the solder layer 20 is 10 μm or less, and is preferably within a range of 0.5 to 10 μm.

In addition, precipitate particles composed of an intermetallic compound including Cu, Ni, and Sn are dispersed in the solder layer 20 and particularly, in the region A having a thickness of up to 30 μm from the surface of the circuit layer 12 in the solder layer 20, a large number of precipitate particles are dispersed. Here, in the present embodiment, the precipitate particles are composed of an intermetallic compound composed of $(Cu, Ni)_6Sn_5$.

In the power module 1 which is the present embodiment, the thermal resistance increase rate when a power cycle is loaded 100,000 times under the conditions of a conduction duration of 5 seconds and a temperature difference of 80° C. is less than 10% in a power cycle test.

Specifically, as the semiconductor device 3, an IGBT device is soldered to the circuit layer 12 and a connection wire composed of an aluminum alloy is bonded to the circuit layer. Then, electric conduction to the IGBT device is controlled to repeat a cycle in which the temperature of the device surface reaches 140° C. when the current is applied (ON) and the temperature of the device surface reaches 60° C. when the current is not applied (OFF) at an interval of 10 seconds, and after the power cycle is repeated 100,000 times, the thermal resistance increase rate is less than 10%.

Figure 3:
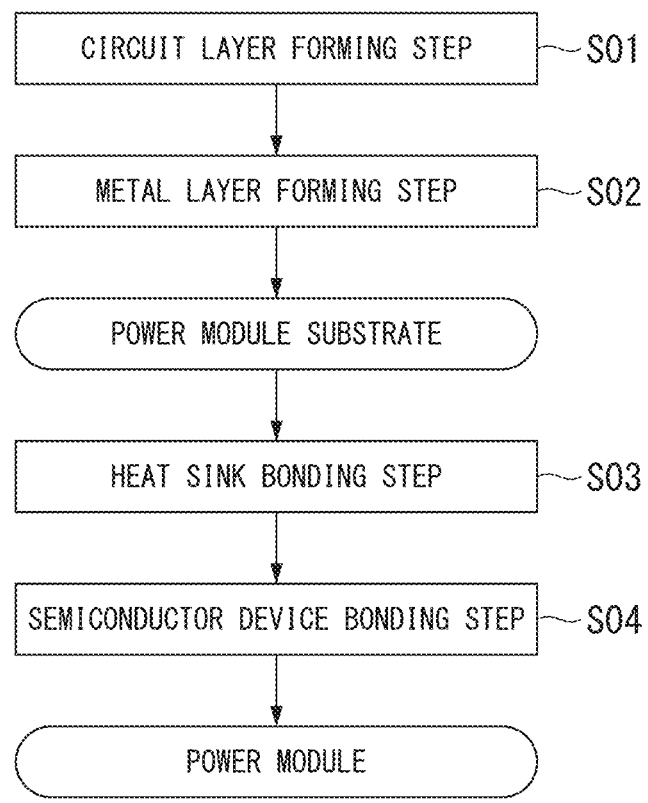
FIG. 3 is a flow diagram showing a method of producing the power module in FIG. 1.

Hereinafter, a method of producing the power module which is the present embodiment will be described with reference to the flow diagram in FIG. 3.

First, a copper plate serving as the circuit layer 12 and the insulating substrate 11 are bonded (circuit layer forming step S01). Here, the insulating substrate 11 and the copper plate serving as the circuit layer 12 are bonded by a so-called active metal brazing method. In the present embodiment, an active brazing material composed of an Ag-27.4% by mass of Cu-2.0% by mass of Ti alloy is used.

The copper plate serving as the circuit layer 12 is laminated on the first surface of the insulating substrate 11 through the active brazing material and the insulating substrate 11 and the copper plate are put into a heating furnace and are heated therein in a state in which the copper plate and the insulating substrate are pressurized in a lamination direction at a pressure of 1 to 35 kgf/cm$^2$ ($9.8 \times 10^4$ to $343 \times 10^4$ Pa) to bond the copper plate serving as the circuit layer 12 and the insulating substrate 11 together. Here, the heating temperature is set to 850° C. and the heating time is set to 10 minutes.

Next, an aluminum plate serving as the metal layer 13 is bonded to the second surface of the insulating substrate 11 (metal layer forming step S02). The aluminum plate is laminated on the insulating substrate 11 through a brazing material and the insulating substrate 11 and the aluminum plate are bonded by brazing. At this time, as the brazing material, for example, an Al—Si-based brazing material foil having a thickness of 20 to 110 μm can be used and the brazing temperature is preferably set to 600° C. to 620° C.

Accordingly, the power module substrate 10 is produced.

Next, the heat sink 41 is bonded to the other surface of the metal layer 13 (heat sink bonding step S03). The second surface of the insulating substrate 11 is bonded to one surface of the metal layer 13. The metal layer 13 is laminated on the top plate portion 42 of the heat sink 41 through a brazing material and the metal layer 13 and the heat sink 41 are bonded by brazing. At this time, as the brazing material, for example, an Al—Si-based brazing material foil having a thickness of 20 to 110 μm can be used and the brazing temperature is preferably set to 590 to 610° C.

Then, the semiconductor device 3 is bonded to the circuit layer 12 (semiconductor device bonding step S04). In the present embodiment, as shown in FIG. 4, a thin Ni plating film 31 having a thickness of 0.2 μm or less is formed on the surface of the circuit layer 12.

Next, the semiconductor device 3 is laminated on the Ni plating film 31 through a solder material 30 of a Sn-0.1 to 4% by mass of Cu-0.01 to 1% by mass of Ni alloy.

In a state in which the semiconductor device 3 is laminated on the power module substrate having the Ni plating film, the semiconductor device and the power module substrate are put into a reducing furnace and the circuit layer 12 and the semiconductor device 3 are bonded together by soldering. At this time, the atmosphere in the reducing furnace is set to a reducing atmosphere containing 1 to 10% by volume of hydrogen, the heating temperature is set to 280° C. to 330° C., and the retaining time is set to 0.5 to 2 minutes. In addition, the cooling rate to room temperature is set to be within a range of 2 to 3° C./s on average.

Accordingly, the power module 1, which is the present embodiment, is produced by forming the solder layer 20 between the circuit layer 12 and the semiconductor device 3.

At this time, Ni in the Ni plating film 31 that is formed on the surface of the circuit layer 12 diffuses into the solder material 30 and thus the Ni plating film 31 disappears.

In addition, Cu of the circuit layer 12 diffuses into the solder material 30 and precipitate particles composed of an intermetallic compound including Cu, Ni, and Sn ((Cu, Ni)$_6$Sn$_5$ in the present embodiment) are dispersed in the solder layer 20. Further, the solder layer 20 has a composition containing Sn as a main component, 0.01 to 1.0% by mass of Ni, and 0.1 to 5.0% by mass of Cu.

In the power module 1 having the above-described configuration which is the embodiment, since the average crystal grain size in the region A having a thickness of up to 30 μm from the surface of the circuit layer 12 in the solder layer 20 formed between the circuit layer 12 and the semiconductor device 3 is 10 μm or less and preferably within a range of 0.5 to 10 μm, even in a case in which cracks are initiated in the solder layer 20 from the circuit layer 12, the cracks are less likely to be propagated along the crystal grain boundaries and thus breaking down of the solder layer 20 can be suppressed.

In addition, in the semiconductor device bonding step S04, since the solder layer 20 has a composition containing Sn as a main component, 0.01 to 1.0% by mass of Ni, and 0.1 to 5.0% by mass of Cu due to diffusion of Cu of the circuit layer 12 and Ni of the Ni plating film 31 into the solder material 30, precipitate particles composed of an intermetallic compound including Cu, Ni, and Sn ((Cu, Ni)$_6$Sn$_5$ in the present embodiment) are dispersed in the solder layer 20 and thus the crystal grain size of the solder layer 20 can be refined.

Further, in the power module 1 having the above-described configuration which is the present embodiment, the thermal resistance increase rate when a power cycle is loaded 100,000 times under the conditions of a conduction duration of 5 seconds and a temperature difference of 80° C. is less than 10% in a power cycle test. Thus, even during loading of the power cycle, the reliability can be improved without breaking down of the solder layer 20 at an early stage.

Furthermore, in the present embodiment, since the thin Ni plating film 31 having a thickness of 0.2 μm or less is formed on the surface of the circuit layer 12, the Ni plating film 31 does not remain during solder bonding of the semiconductor device 3 and diffusion of Cu of the circuit layer 12 into the solder material 30 is not suppressed. Thus, precipitate particles composed of (Cu, Ni)$_6$Sn$_5$ can be reliably dispersed in the solder layer 20 and the crystal grain size can be refined.

Second Embodiment

Next, a power module which is a second embodiment of the present invention will be described with reference to attached drawings. In addition, the same members as those of the first embodiment will be given the same reference numerals, the explanation of which will be omitted here.

Figure 5:
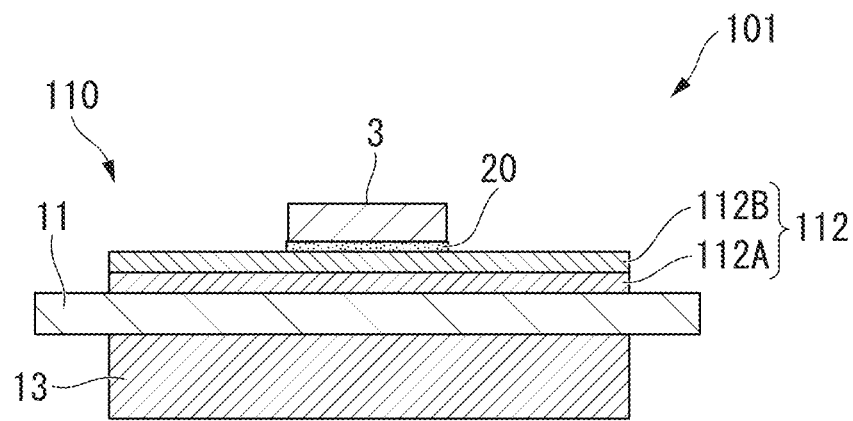
FIG. 5 is a schematic explanatory diagram of a power module which is a second embodiment of the present invention.

In FIG. 5, a power module 101 which is the second embodiment of the present invention is shown. The power module 101 includes a power module substrate 110 in which a circuit layer 112 is formed on one surface (first surface) of the insulating substrate (insulating layer) 11, and a semiconductor device 3 that is mounted on the circuit layer 112 (the upper surface in FIG. 5).

The power module substrate 110 includes the insulating substrate 11 that forms the insulating layer, the circuit layer 112 that is arranged on one surface of the insulating substrate 11 (which is the first surface and the upper surface in FIG. 5), and the metal layer 13 that is arranged on the other surface of the insulating substrate 11 (which is the second surface and the lower surface in FIG. 5).

As shown in FIG. 5, the circuit layer 112 includes an aluminum layer 112A that is formed on the first surface of the insulating substrate 11, and a copper layer 112B that is laminated on one surface of the aluminum layer 112A. The other surface of the aluminum layer 112A is bonded to the first surface of the insulating substrate 11.

Here, in the present embodiment, the aluminum layer 112A is formed by bonding a rolled plate of aluminum having a purity of 99.99% by mass or more to the insulating substrate. In addition, the copper layer 112B is formed by bonding a copper plate composed of a rolled plate of oxygen-free copper to one surface of the aluminum layer 112A by solid-phase diffusion.

One surface of the circuit layer 112 (upper surface in FIG. 5) is a surface to which the semiconductor device 3 is bonded. Here, the thickness of the circuit layer 112 is preferably set to be within a range of 0.25 to 6.0 mm. In addition, the thickness of the aluminum layer 112A (aluminum plate) is preferably set to be within a range of 0.2 to 3.0 mm and the thickness of the copper layer 112B is preferably set to be within a range of 50 μm to 3.0 mm.

Figure 6:
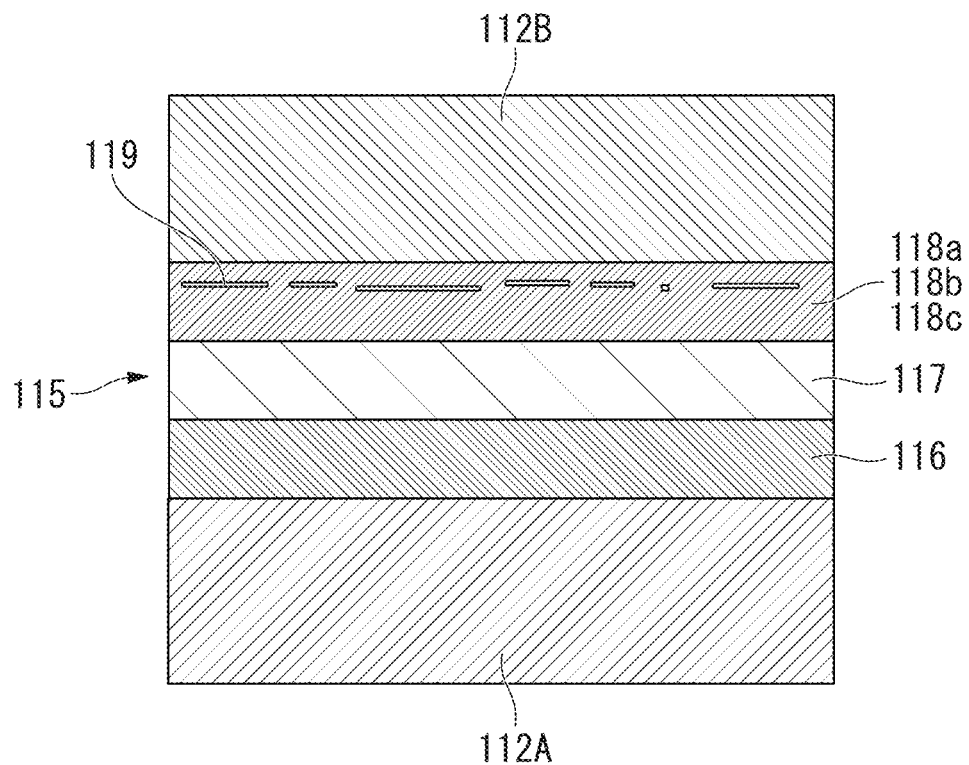
FIG. 6 is an enlarged explanatory diagram of a bonding interface between a copper layer and an aluminum layer in FIG. 5.

Here, as shown in FIG. 6, a diffusion layer 115 is formed at the interface between the aluminum layer 112A and the copper layer 112B.

The diffusion layer 115 is formed by mutual diffusion of Al atoms of the aluminum layer 112A and Cu atoms of the copper layer 112B. In the diffusion layer 115, a concentration gradient in which the aluminum atom concentration decreases gradually and the copper atom concentration increases from the aluminum layer 112A to the copper layer 112B is formed.

As shown in FIG. 6, the diffusion layer 115 is composed of an intermetallic compound of Al and Cu and has a structure in which multiple intermetallic compounds are laminated along the bonding interface in the present embodiment. Here, the thickness of the diffusion layer 115 is set to be within a range of 1 to 80 μm, and preferably within a range of 5 to 80 μm.

Figure 7:
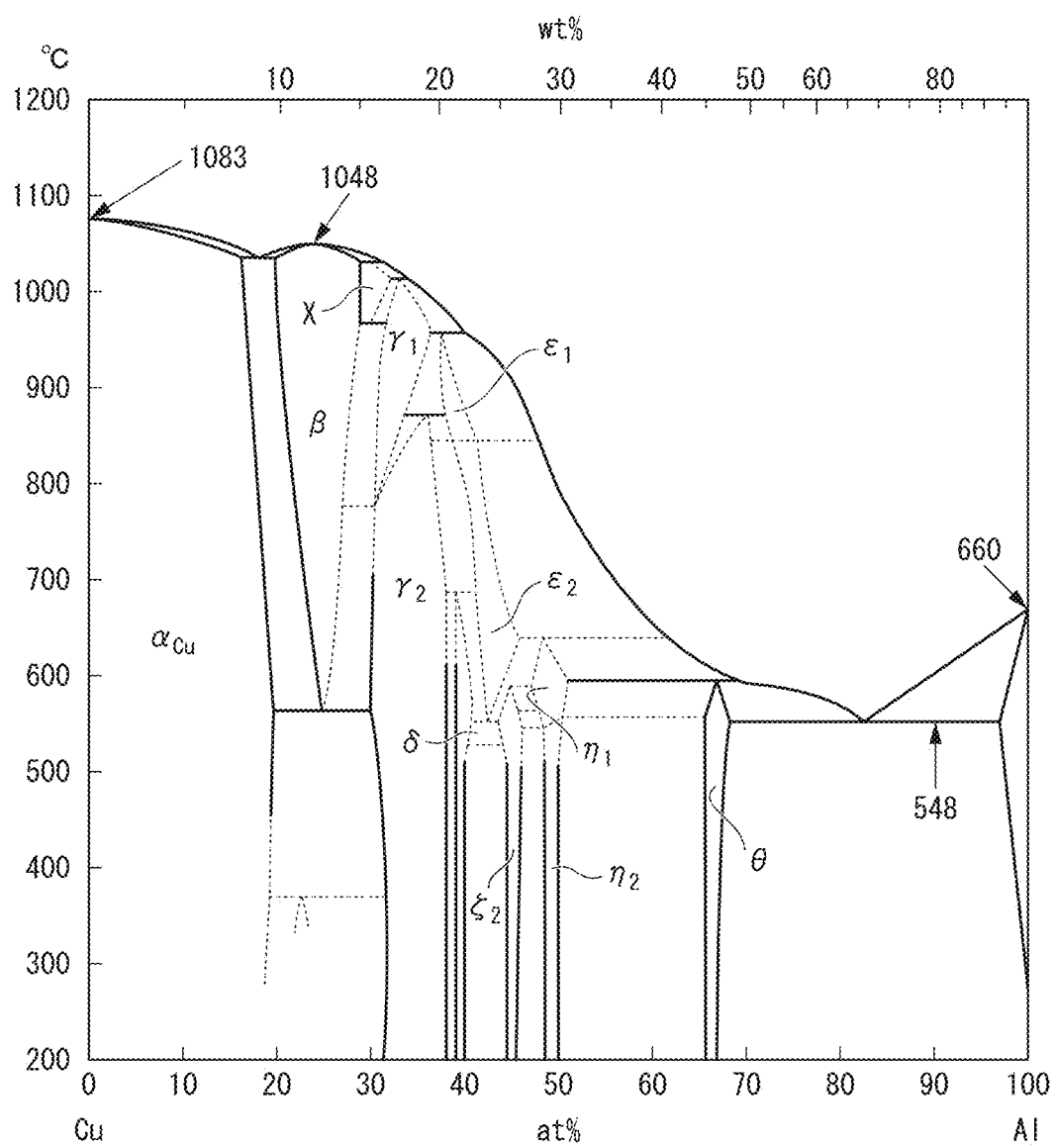
FIG. 7 is a binary phase diagram of Cu and Al.

In the present embodiment, as shown in FIG. 6, a θ phase 116 and an η$_2$ phase 117 are laminated along the bonding interface between the aluminum layer 112A to the copper layer 112B sequentially from the aluminum layer 112A to the copper layer 112B, and further, at least one of a ζ$_2$ phase 118a, a δ phase 118b, and a γ$_2$ phase 118c is laminated (refer to the phase diagram of FIG. 7).

Further, in the present embodiment, along the interface between the copper layer 112B and the diffusion layer 115, an oxide 119 is dispersed in a laminated state in the layer composed of at least one of the ζ$_2$ phase 118a, the δ phase 118b, and the γ$_2$ phase 118c. The oxide 119 is composed of an aluminum oxide such as alumina (Al$_2$O$_3$) or the like.

In the power module 101 which is the present embodiment, the circuit layer 112 (copper layer 112B) and the semiconductor device 3 are bonded together by soldering and the solder layer 20 is formed between the circuit layer 112 (copper layer 112B) and the semiconductor device 3. The solder layer 20 is formed by using a Sn—Cu—Ni-based solder material as in the first embodiment, and in the present embodiment, a solder material of a Sn-0.1 to 4% by mass of Cu-0.01 to 1% by mass of Ni alloy is used.

Figure 8:
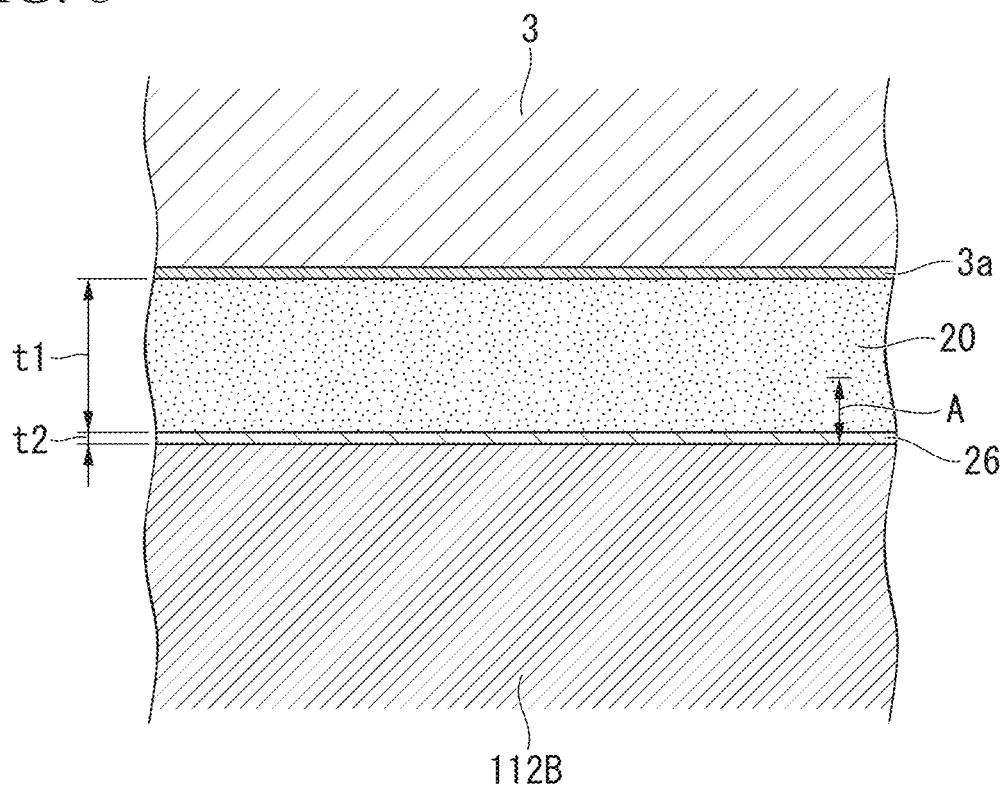
FIG. 8 is an enlarged explanatory diagram of a portion in which a circuit layer and a semiconductor device are bonded to each other in FIG. 5.

Here, as shown in FIG. 8, the intermetallic compound layer 26 is formed on the surface of the circuit layer 112 (copper layer 112B) and the solder layer 20 is arranged on the intermetallic compound layer 26 in a laminated manner. The intermetallic compound layer 26 is composed of an intermetallic compound ($Cu_3Sn$) of Cu and Sn. The thickness t2 of the intermetallic compound layer 26 is set to 0.8 μm or less.

The solder layer 20 has a composition containing Sn as a main component, 0.01 to 1.0% by mass of Ni, and 0.1 to 5.0% by mass of Cu.

As shown in FIG. 8, the average crystal grain size which is measured by EBSD measurement in the region A having a thickness of up to 30 μm from the surface of the circuit layer 112 (copper layer 112B) in the solder layer 20 is 10 μm or less and preferably within a range of 0.5 to 10 μm.

In addition, precipitate particles composed of an intermetallic compound including Cu, Ni, and Sn are dispersed in the solder layer 20 and particularly, in the region A having a thickness of up to 30 μm from the surface of the circuit layer 112 (copper layer 112B) in the solder layer 20, a large number of precipitate particles are dispersed. Here, in the present embodiment, the precipitate particles are composed of an intermetallic compound composed of $(Cu, Ni)_6Sn_5$.

In the power module 101 which is the present embodiment, a thermal resistance increase rate when a power cycle is loaded 100,000 times under the conditions of a conduction duration of 5 seconds and a temperature difference of 80° C. is less than 10% in a power cycle test.

Specifically, as the semiconductor device 3, an IGBT device is soldered to the circuit layer 112 (copper plate 112B) and a connection wire composed of an aluminum alloy is bonded to the circuit layer. Then, electric conduction to the IGBT device is controlled to repeat a cycle in which the temperature of the device surface reaches 140° C. when the current is applied (ON) and the temperature of the device surface reaches 60° C. when the current is not applied (OFF) at an interval of 10 seconds, and after the power cycle is repeated 100,000 times, the thermal resistance increase rate is less than 10%.

Figure 9:
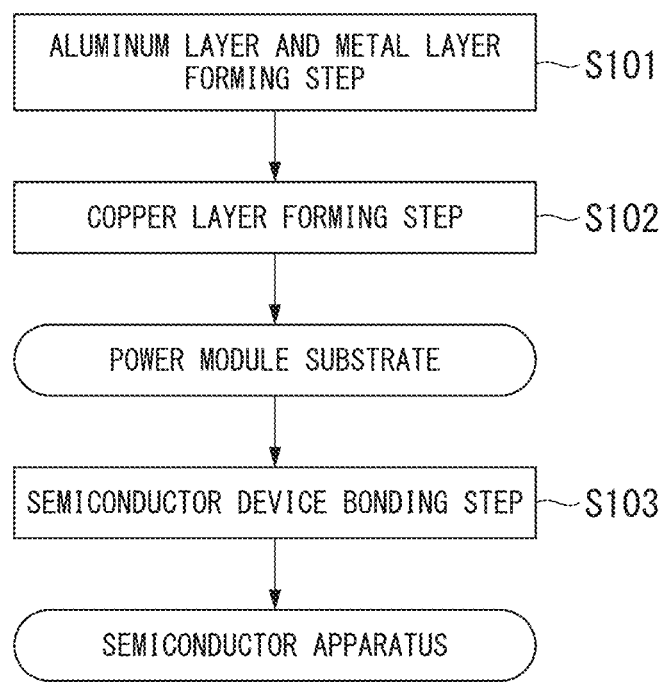
FIG. 9 is a flow diagram showing a method of producing the power module in FIG. 5.

Hereinafter, a method of producing the power module 101 which is the present embodiment will be described using the flow diagram in FIG. 9.

First, the aluminum layer 112A and the metal layer 13 are formed by bonding the aluminum plate and the first surface of the insulating substrate 11 and bonding the aluminum plate and the second surface thereof (aluminum layer and metal layer forming step S101).

The aluminum plate is laminated on the insulating substrate 11 through a brazing material to bond the insulating substrate 11 and the aluminum plate together by brazing. At this time, as the brazing material, for example, an Al—Si-based brazing material foil having a thickness of 20 to 110 μm can be used and the brazing temperature is preferably set to 600 to 620° C.

Next, a copper plate is bonded to one surface of the aluminum layer 112A to form a copper layer 112B (copper layer forming step S102). In addition, the other surface of the aluminum layer 112A is a surface to which the first surface of the insulating substrate 11 is bonded in the aluminum layer and metal layer forming step S101.

The copper plate is laminated on the aluminum layer 112A and the copper plate and the aluminum layer are put into a vacuum heating furnace and are heated therein in a state in which the copper plate and the aluminum layer are pressurized in a lamination direction (at a pressure of 3 to 35 $kgf/cm^2$) to bond the aluminum layer 112A and the copper plate together by solid-phase diffusion. Here, in the copper layer forming step S102, the heating temperature is set to 400 to 548° C. and the heating time is set to 15 to 270 minutes. When the aluminum layer 112A and the copper plate are bonded by solid-phase diffusion, the heating temperature is preferably set to be within a range from a temperature 5° C. lower than the eutectic temperature (548.8° C.) of Al and Cu to a temperature lower than the eutectic temperature.

Through the copper layer forming step S102, the circuit layer 112 composed of the aluminum layer 112A and the copper layer 112B is formed on the first surface of the insulating substrate 11.

The semiconductor device 3 is bonded to the circuit layer 112 (copper layer 112B) (semiconductor device bonding step S103). In the present embodiment, a thin Ni plating film having a thickness of 0.2 μm or less is formed on the surface of the circuit layer 112 (copper layer 112B).

Next, the semiconductor device 3 is laminated on the Ni plating film through the solder material of a Sn-0.1 to 4% by mass of Cu-0.01 to 1% by mass of Ni alloy.

In a state in which the semiconductor device 3 is laminated on the power module substrate having the Ni plating film, the semiconductor device and the power module substrate are put into a reducing furnace and the circuit layer 112 (copper layer 112B) and the semiconductor device 3 are bonded together by soldering. At this time, the atmosphere in the reducing furnace is set to a reducing atmosphere containing 1 to 10% by volume of hydrogen, the heating temperature is set to 280 to 330° C., and the retaining time is set to 0.5 to 2 minutes. In addition, the cooling rate to room temperature is set to be within a range of 2 to 3° C./s on average.

Accordingly, the power module 101, which is the present embodiment, is produced by forming the solder layer 20 between the circuit layer 112 (copper layer 112B) and the semiconductor device 3.

At this time, Ni in the Ni plating film that is formed on the surface of the circuit layer 112 (copper plate 112B) diffuses into the solder material and thus the Ni plating film disappears.

In addition, Cu of the copper layer 112B diffuses into the solder material and thus precipitate particles composed of an intermetallic compound including Cu, Ni, and Sn ($(Cu,Ni)_6Sn_5$ in the present embodiment) are dispersed in the solder layer 20. Further, the solder layer 20 has a composition containing Sn as a main component, 0.01% by mass or more and 1.0% by mass or less of Ni, and 0.1% by mass or more and 5.0% by mass or less of Cu.

In the power module 101 having the above-described configuration, which is the present embodiment, the same effects as in the first embodiment can be obtained.

Further, since the circuit layer 112 has the copper layer 112B in the present embodiment, heat generated from the semiconductor device 3 can be spread in a plane direction by the copper layer 112B and the heat can be effectively transferred to the power module substrate 110.

Further, since the aluminum layer 112A having relatively low deformation resistance is formed on the first surface of the insulating substrate 11, the thermal resistance generated during loading of a heat cycle can be absorbed by the aluminum layer 112A and thus cracking of the insulating substrate 11 can be suppressed.

In addition, since the copper layer 112B composed of copper or a copper alloy having relatively high deformation resistance is formed on one surface of the circuit layer 112, deformation of the circuit layer 112 during loading of a heat cycle can be suppressed and thus high reliability with respect to the power cycle can be obtained. Also, the other surface of the circuit layer 112 is a surface to be bonded with the first surface of the insulating substrate 11.

Further, since the aluminum layer 112A and the copper layer 112B are bonded by solid-phase diffusion and the temperature during the solid-phase diffusion bonding is set to 400° C. or higher in the present embodiment, diffusion of Al atoms and Cu atoms is promoted and the solid-phase diffusion can be sufficiently achieved in a short period of time. In addition, since the temperature during the solid-phase diffusion is set to 548° C. or lower, it is possible to suppress the formation of a bump at the bonding interface between the aluminum layer 112A and the copper layer 112B without the formation of a liquid phase of Al and Cu or to suppress a change in thickness.

Further, when the heating temperature of the above-described solid-phase diffusion bonding is set to be within a range from a temperature 5° C. lower than the eutectic temperature (548.8° C.) of Al and Cu to a temperature lower than the eutectic temperature, it is possible to suppress the formation of a compound of Al and Cu more than necessary. Also, the diffusion rate during solid-phase diffusion bonding is ensured and thus solid-phase diffusion bonding can be achieved in a relatively short period of time.

The embodiments of the present invention have been described above. However, the present invention is not limited thereto and may be appropriately modified without departing from the technical scope of the invention.

For example, the metal layer is composed of 4N aluminum having a purity of 99.99% by mass or more in the present embodiment. However, there is no limitation thereto and the metal layer may be composed of other aluminum or an aluminum alloy and may be composed of copper or a copper alloy.

In addition, for example, a rolled plate of oxygen-free copper is used as the metal plate serving as the circuit layer in the present embodiment. However, there is no limitation thereto and the metal layer may be composed of other copper or copper alloy.

Further, an insulating substrate composed of AlN is used as the insulating layer. However, there is no limitation thereto and an insulating substrate composed of $Al_2O_3$, $Si_3N_4$, or the like may be used.

In addition, the insulating substrate and the copper plate serving as the circuit layer are bonded by the active metal brazing method. However, there is no limitation thereto and the insulating substrate and the copper plate may be bonded by a DBC method, a casting method, or the like.

Further, the insulating substrate and the aluminum plate serving as the metal layer are bonded together by brazing. However, there is no limitation thereto and a transient liquid phase bonding method, a metal paste method, a casting method, or the like may be applied.

Furthermore, the composition of the solder material is not limited to the present embodiment and the composition of the solder layer formed after solder bonding may contain Sn as a main component, 0.01 to 1.0% by mass of Ni, and 0.1 to 5.0% by mass of Cu.

In the second embodiment, the copper plate is bonded to one surface of the aluminum layer by solid-phase diffusion bonding to form the copper layer on the bonding surface of the circuit layer. However, there is no limitation thereto and the method of forming the copper layer is not limited.

For example, the copper layer may be formed on one surface of the aluminum layer by a plating method. When a copper layer having a thickness of about 5 to 50 μm is formed, a plating method is preferably used. When a copper layer having a thickness of about 50 μm to 3 mm is formed, solid-phase diffusion bonding is preferably used.

EXAMPLE 1

Hereinafter, description will be made with respect to results of confirmation experiments that have been performed to confirm the effectiveness of the present invention.

A power module described in the aforementioned first embodiment was prepared. As the insulating substrate, a substrate composed of AlN having a size of 27 mm×17 mm and a thickness of 0.6 mm was used. In addition, as the circuit layer, a plate composed of oxygen-free copper and having a size of 25 mm×15 mm and a thickness of 0.3 mm was used. As the metal layer, a plate composed of 4N aluminum and having a size of 25 mm×15 mm and a thickness of 0.6 mm was used. As the semiconductor device, an IGBT device having a size of 13 mm×10 mm and a thickness of 0.25 mm was used. As the heat sink, an aluminum plate (A6063) having a size of 40.0 mm×40.0 mm×2.5 mm was used.

Here, the composition of the solder layer after solder bonding, the average crystal grain size, and the like were adjusted by adjusting the thickness of the Ni plating film formed on the surface of the circuit layer and changing the composition of the solder material as shown in Table 1 and thus various power modules of Examples 1 to 8 and Comparative Examples 1 to 5 were prepared.

As for the conditions for solder bonding, a reducing atmosphere containing 3% by volume of hydrogen was set, the heating temperature (heating target temperature) and the retaining time were set as conditions of Table 1, and the average cooling rate to room temperature was set to 2.5° C./s.

(Crystal Grain Size)

In the power modules obtained as described above, the average crystal grain size in the region having a thickness of up to 30 mm in the solder layer formed between the circuit layer and the IGBT device was measured by EBSD measurement.

The EBSD measurement was performed using an EBSD measuring apparatus (Quanta FEG 450, manufactured by FEI Inc., OIM Data Collection manufactured by EDAX/TSL Inc.) and analysis software (OIM Data Analysis ver. 5.3 developed by EDAX/XTL Inc.) under the conditions in which the electron beam acceleration voltage was 20 kV, the measurement step was 0.6 μm, the measurement range was 300 μm×50 μm, and the analysis range was 300 μm×30 μm.

(Composition of Solder Layer)

The components of the solder layer were analyzed by EPMA analysis. Using EPMA analysis apparatus (JXA-8530F, manufactured by JEOL Ltd.), the average composition of the solder layer was analyzed under the conditions in which the acceleration voltage was 15 kV, the spot diameter was 1 μm or less, and the magnification was 250 times.

(Power Cycle Test)

The electric conduction to the IGBT device was controlled to repeat a cycle in which the temperature of the device surface reached 140° C. when the current was applied (ON) and the temperature of the device surface reached 60° C. when the current was not applied (OFF) at an interval of 10 seconds, and the power cycle was repeated 100,000 times. Then, the thermal resistance increase rate from the initial state was evaluated. In all Examples 1 to 8, the thermal resistance increase rate when the power cycle is repeated 100,000 times is less than 10%.

(Power Cycle Life)

The electric conduction to the IGBT device was controlled to repeat a cycle in which the temperature of the device surface reached 140° C. when the current was applied (ON) and the temperature of the device surface reached 60° C. when the current was not applied (OFF) at an interval of 10 seconds, and the power cycle was repeated. Then, the number of power cycles when the increase rate of thermal resistance from the initial state reached 10% or more (power cycle life) was evaluated.

(Thermal Resistance Measurement)

As the thermal resistance, a transient thermal resistance was measured by using a thermal resistance tester (4324-KT, manufactured by TESEC Corporation). The thermal resistance was obtained by measuring a voltage difference between the gate and the emitter after power application while setting the application power to 100 W and the application time to 100 ms. The measurement was performed in every 10,000$^{th}$ cycle in the aforementioned power cycle test.

EXAMPLE 2

Next, the power module having a circuit layer composed of an aluminum layer and a copper layer as described in the second embodiment was prepared.

As the insulating substrate, a substrate composed of AlN having a size of 27 mm×17 mm and a thickness of 0.6 mm was used. As the metal layer, a plate composed of 4N aluminum and having a size of 25 mm×15 mm and a thickness of 0.6 mm was used. As the semiconductor device, an IGBT device having a size of 13 mm×10 mm and a thickness of 0.25 mm was used. As the heat sink, an aluminum plate (A6063) having a size of 40.0 mm×40.0 mm×2.5 mm was used.

As the aluminum layer in the circuit layer, an aluminum layer composed of 4N aluminum and having a size of 25 mm×15 mm and a thickness of 0.6 mm was used. Then, the copper layer was formed by solid-phase diffusion bonding as shown in Table 2.

TABLE 1

| | | Composition of solder material (% by mass) | | | Thickness of Ni plating (μm) | Soldering temperature (° C.) | Soldering retaining time (minutes) | Composition of solder layer (% by mass) | | | Crystal grain size (μm) | Power cycle life* |
|---|---|---|---|---|---|---|---|---|---|---|---|---|
| | | Ni | Cu | Sn and unavoidable impurities | | | | Ni | Cu | Sn and unavoidable impurities | | |
| Example of Present Invention | 1 | 0.03 | 0.7 | Balance | 0 | 300 | 1.5 | 0.03 | 2.70 | Balance | 8 | 130,000 |
| | 2 | 0.95 | 0.4 | Balance | 0 | 300 | 1.5 | 0.93 | 2.40 | Balance | 2 | 110,000 |
| | 3 | 0.90 | 0.1 | Balance | 0 | 280 | 0.5 | 0.90 | 0.20 | Balance | 1 | 130,000 |
| | 4 | 0.06 | 3.9 | Balance | 0 | 330 | 1 | 0.06 | 4.90 | Balance | 5 | 140,000 |
| | 5 | 0.90 | 3.5 | Balance | 0 | 300 | 1 | 0.89 | 4.50 | Balance | 0.5 | 140,000 |
| | 6 | 0.04 | 0.2 | Balance | 0 | 300 | 1 | 0.04 | 1.20 | Balance | 9 | 110,000 |
| | 7 | 0.03 | 0.7 | Balance | 0.2 | 300 | 1 | 0.16 | 1.70 | Balance | 8 | 170,000 |
| | 8 | 0.08 | 1.0 | Balance | 0 | 300 | 1 | 0.08 | 2.10 | Balance | 5 | 180,000 |
| Comparative Example | 1 | 0.00 | 1.0 | Balance | 0 | 300 | 1 | 0.00 | 2.00 | Balance | 14 | 70,000 |
| | 2 | 1.50 | 0.7 | Balance | 0 | 300 | 1 | 1.49 | 1.70 | Balance | 4 | 80,000 |
| | 3 | 0.03 | 0.0 | Balance | 5 | 300 | 1 | 0.18 | 0.00 | Balance | 13 | 80,000 |
| | 4 | 0.04 | 4.0 | Balance | 0 | 300 | 1.5 | 0.04 | 6.00 | Balance | 5 | 90,000 |
| | 5 | 0.04 | 0.1 | Balance | 0 | 300 | 2 | 0.04 | 1.50 | Balance | >15 | 80,000 |

*Power cycle life: Number of cycles when the thermal resistance was increased by 10%.

Figure 10:
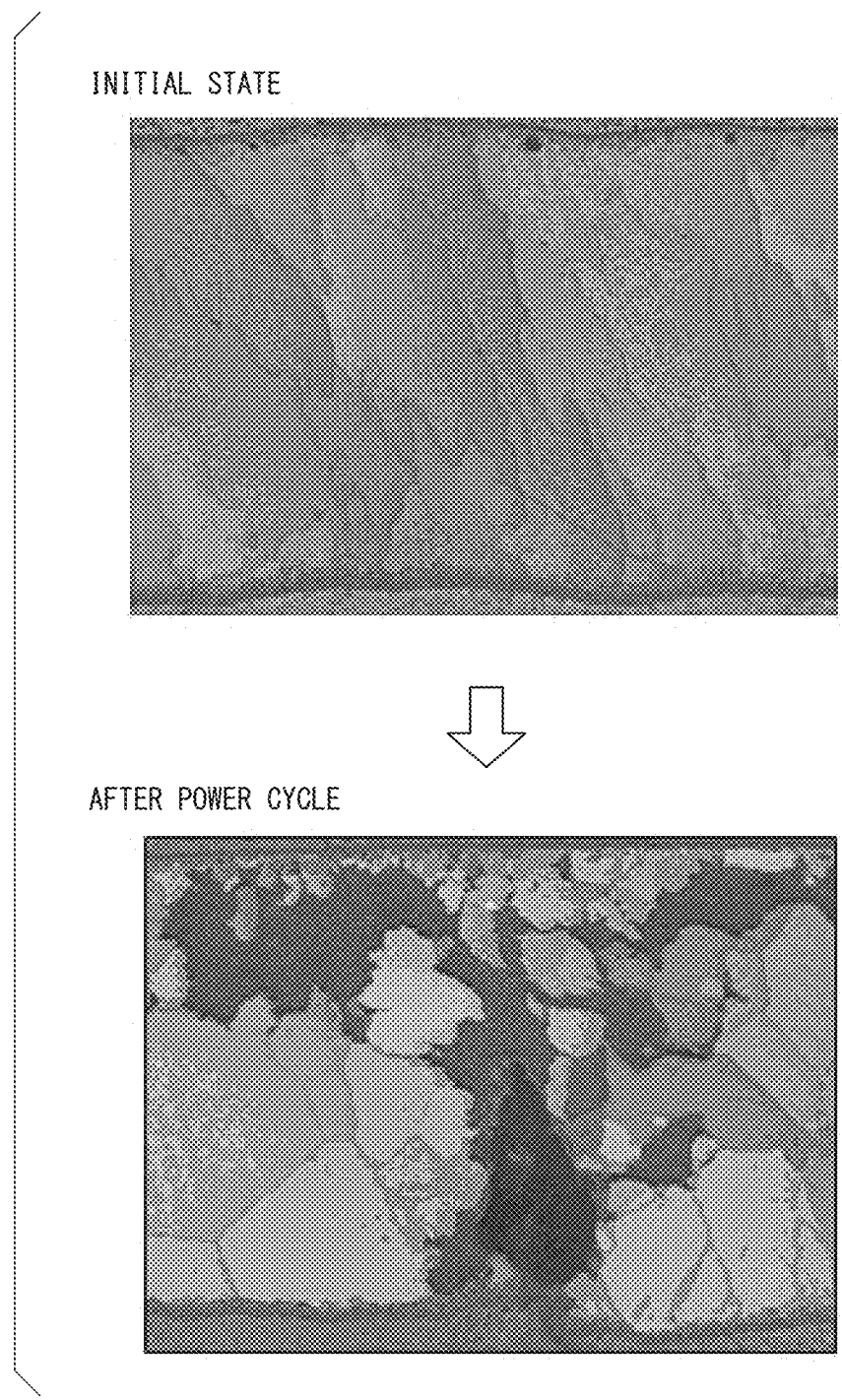
FIG. 10 shows images of EBSD measurement results of a solder layer of a power module in Comparative Example 1 at the initial stage and after loading of a power cycle.

In Comparative Examples 1, 3 and 5 in which the crystal grain size of the solder layer was 10 μm or more and was coarse, the power cycle life was 70,000 times to 80,000 times and was short. As a result of observing the cross section of the solder layer of Comparative Example 1 after the power cycle was repeated 100,000 times, as shown in FIG. 10, it was confirmed that the solder layer was broken down.

In addition, in Comparative Examples 2 and 4 in which the composition of the solder layer was outside of the range of the present invention, the power cycle life was 80,000 to 90,000 times and was short. The reason is assumed in that there are large amounts of Ni and Cu and thus inclusions are formed in the solder layer and the solder layer is broken down from the inclusions.

Figure 11:
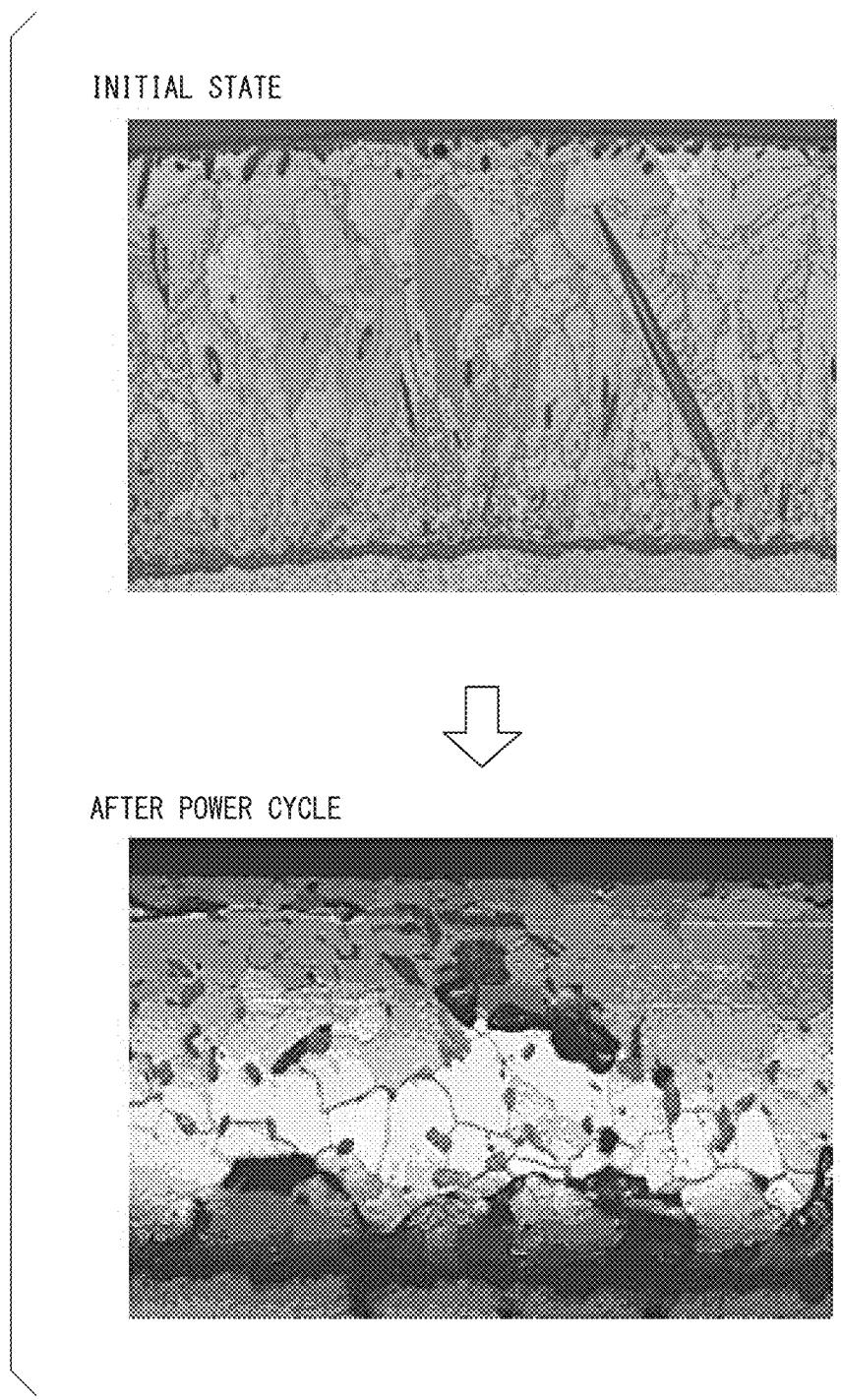
FIG. 11 shows images of EBSD measurement results of a solder layer of a power module in Example 1 at the initial stage and after loading of a power cycle.

In contrast, in all Examples 1 to 8, it is confirmed that the power cycle life is 110,000 times or more and breaking down of the solder layer is suppressed. As a result of observing the cross section of the solder layer of Example 1 after the power cycle was repeated 100,000 times, as shown in FIG. 11, it is confirmed that the propagation of cracks along the crystal grain boundaries is suppressed.

As described above, according to Examples, it was confirmed that a power module having excellent power cycle properties could be obtained.

In a case of using plating, the surface of the aluminum layer was subjected to zincate treatment and then a copper layer having the thickness shown in Table 2 was formed by electrolytic plating.

In a case of using solid-phase diffusion bonding, a copper plate having the thickness shown in Table 2 was prepared and the copper plate was bonded to the surface of the aluminum layer by solid-phase diffusion under the conditions shown in the second embodiment as an example.

As described above, various power modules of Examples 11 to 16 were prepared.

As for the conditions for solder bonding, a reducing atmosphere containing 3% by volume of hydrogen was set, the heating temperature (heating target temperature) and the retaining time were set as conditions of Table 2 and the average cooling rate to room temperature was set to 2.5° C./s.

Then, the composition of the solder layer, the crystal grain size, and the power cycle life were evaluated by the same methods as in Example 1. The evaluation results are shown in Table 2.

TABLE 2

| | | Composition of solder material (% by mass) | | | Thickness of copper layer (mm) | Formation method of copper layer | Soldering temperature (° C.) | Soldering retaining time (minutes) | Composition of solder layer (% by mass) | | | Crystal grain size (μm) | Power cycle life* |
|---|---|---|---|---|---|---|---|---|---|---|---|---|---|
| | | Ni | Cu | Sn and unavoidable impurities | | | | | Ni | Cu | Sn and unavoidable impurities | | |
| Example of Present Invention | 11 | 0.08 | 1.0 | Balance | 0.005 | Plating | 300 | 1 | 0.07 | 2.09 | Balance | 3 | 110,000 |
| | 12 | 0.08 | 1.0 | Balance | 0.01 | Plating | 300 | 1 | 0.07 | 2.08 | Balance | 3 | 120,000 |
| | 13 | 0.08 | 1.0 | Balance | 0.03 | Plating | 300 | 1 | 0.08 | 2.08 | Balance | 5 | 160,000 |
| | 14 | 0.08 | 1.0 | Balance | 0.05 | Solid-phase diffusion | 300 | 1 | 0.07 | 2.08 | Balance | 4 | 140,000 |
| | 15 | 0.08 | 1.0 | Balance | 0.3 | Solid-phase diffusion | 300 | 1 | 0.08 | 2.10 | Balance | 5 | 180,000 |
| | 16 | 0.08 | 1.0 | Balance | 3 | Solid-phase diffusion | 300 | 1 | 0.08 | 2.11 | Balance | 8 | 110,000 |

*Power cycle life: Number of cycles when the thermal resistance was increased by 10%.

As shown in Table 2, in all Examples 11 to 16, it is confirmed that the power cycle life is 110,000 times or more and breaking down of the solder layer is suppressed. Even in a case in which the circuit layer is formed by forming copper layers having different thicknesses on the aluminum layer, as in Example 1, it is confirmed that the power cycle properties can be improved.

In addition, when the thickness of the copper layer was 5 μm or more, it was confirmed that all the Cu in the copper layer did not diffuse into the solder and the copper layer remained. Further, when the thickness of the copper layer was 3 mm or less, it was confirmed that the power cycle life was 100,000 times or more.

INDUSTRIAL APPLICABILITY

According to the present invention, it is possible to provide a power module capable of suppressing the occurrence of breaking down of a solder layer at an early stage even when a power cycle is loaded, and having high reliability.

REFERENCE SIGNS LIST

1: POWER MODULE
3: SEMICONDUCTOR DEVICE
10: POWER MODULE SUBSTRATE
11: INSULATING SUBSTRATE (INSULATING LAYER)
12: CIRCUIT LAYER (COPPER LAYER)
13: METAL LAYER
20: SOLDER LAYER
26: INTERMETALLIC COMPOUND LAYER
30: SOLDER MATERIAL
31: NI PLATING FILM
101: POWER MODULE
112: CIRCUIT LAYER
112A: ALUMINUM LAYER
112B: COPPER LAYER

The invention claimed is:

1. A power module comprising:
a power module substrate that has a circuit layer arranged on one surface of an insulating layer; and
a semiconductor device that is bonded to one surface of the circuit layer,
wherein a copper layer composed of copper or a copper alloy is formed on the surface of the circuit layer to which the semiconductor device is bonded,
a solder layer that is formed by using a solder material is formed between the circuit layer and the semiconductor device,
an average crystal grain size which is measured by EBSD measurement in a region having a thickness of up to 30 μm from the surface of the circuit layer in the solder layer is within a range of 0.1 to 10 μm,
the solder layer has a composition that contains Sn as a main component, 0.01 to 1.0% by mass of Ni, and 0.1 to 5.0% by mass of Cu, and
a thermal resistance increase rate when a power cycle is loaded 100,000 times under conditions of a conduction duration of 5 seconds and a temperature difference of 80° C. is less than 10% in a power cycle test.

2. The power module according to claim 1,
wherein precipitate particles composed of $(Cu, Ni)_6Sn_5$ are dispersed in the solder layer.

* * * * *